(12) United States Patent
Obata

(10) Patent No.: US 6,369,336 B1
(45) Date of Patent: Apr. 9, 2002

(54) PRINTED CIRCUIT BOARD

(75) Inventor: Hiroyuki Obata, Kanagawa (JP)

(73) Assignee: The Whitaker Corporation, Wilmington, DE (US)

(*) Notice: Subject to any disclaimer, the term of this patent is extended or adjusted under 35 U.S.C. 154(b) by 0 days.

(21) Appl. No.: 09/267,442

(22) Filed: Mar. 12, 1999

(30) Foreign Application Priority Data

Mar. 13, 1998 (JP) .......................................... 10-082898

(51) Int. Cl.⁷ ................................................. H05K 1/11
(52) U.S. Cl. ........................ 174/266; 361/785; 361/786; 361/789; 439/60
(58) Field of Search .......................... 174/266; 361/784, 361/785, 786, 787, 788, 789, 792, 795; 439/55, 57, 59, 60, 62, 951; 307/137

(56) References Cited

U.S. PATENT DOCUMENTS 3,518,612 A * 6/1970 Dunman et al. .......... 439/59 X
3,651,432 A * 3/1972 Henschen et al. ........ 439/62 X

FOREIGN PATENT DOCUMENTS

JP 08-241755 9/1996

* cited by examiner

Primary Examiner—Albert W. Paladini

(57) ABSTRACT

A printed circuit board is disclosed which has conductive pads located near an edge of a board main body on its upper and lower surfaces to reduce the width in the direction of contact sliding and to provide for a smoother connection between electrical contacts of an electrical connector and the conductive pads despite a powdered substance produced as a result of friction between the conductive pads and the electrical contacts. The printed circuit board (1) has conductive pads (14a, 14b) on upper and lower surfaces of the board main body (2) near the edge (3) of the main body (2). Electrical contacts (20) slide over the conductive pads (14a, 14b) from the edge (3) of the board main body (2). The conductive pads (14a, 14b) are connected together by via holes (15a) that are located in the paths of the contacts (20).

5 Claims, 4 Drawing Sheets

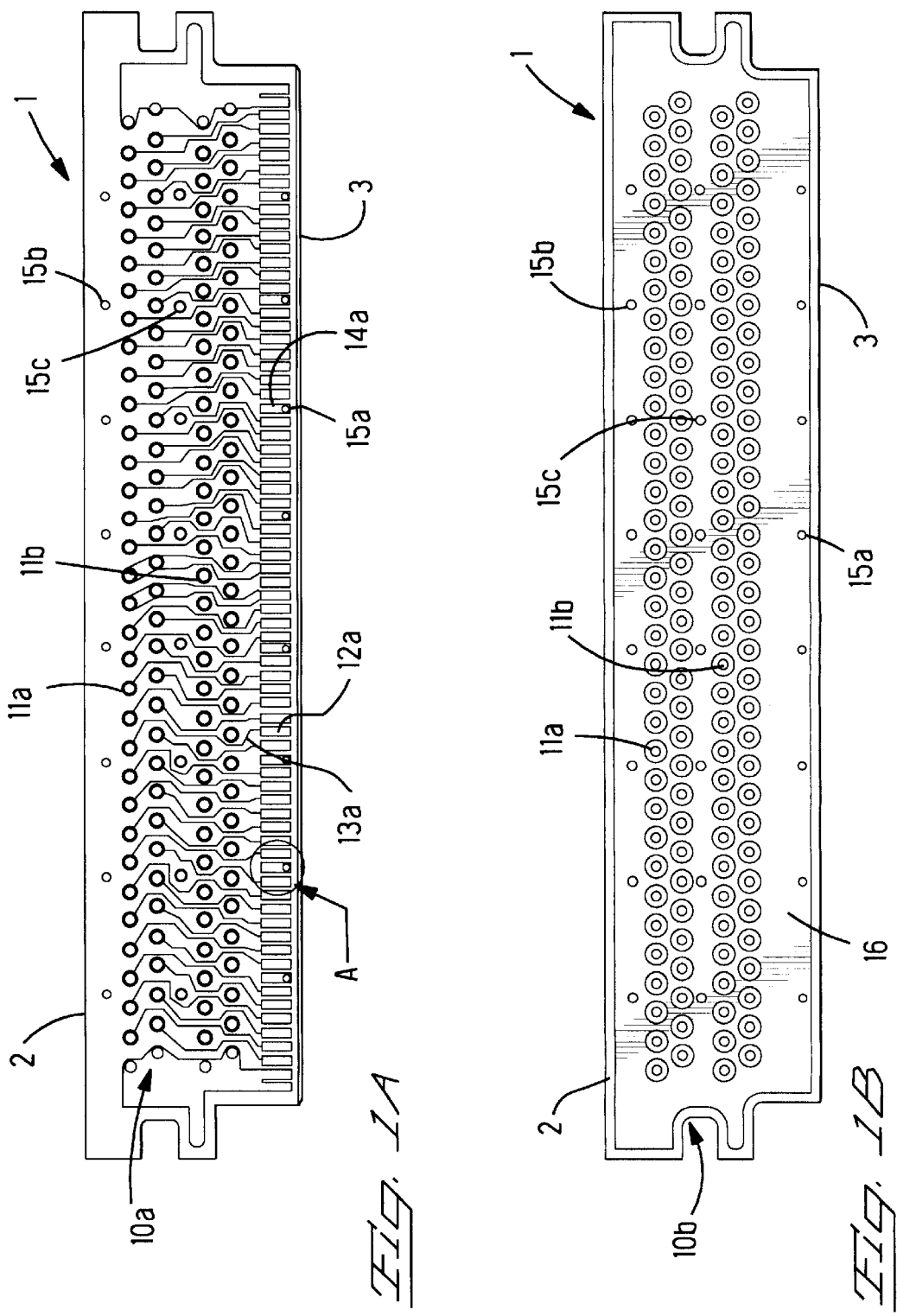

PRINTED CIRCUIT BOARD

FIELD OF THE INVENTION

The present invention relates to printed circuit boards and more particularly to printed circuit boards having conductive pads formed on upper and lower surfaces near an edge of a board main body that make electrical connection with sliding electrical contacts.

BACKGROUND OF THE INVENTION

An example of a printed circuit board of this type is shown in FIG. 5 as disclosed in Japanese Patent Disclosure No. 96-241755. Printed circuit board 100 comprises a board main body 101 having multiple conductive pads 102 formed on upper and lower surfaces of the main body. The conductive pads 102 are arranged in one row on both surfaces of the board main body 101 along and near edge 103 of the main body.

On the other hand, housing 111 of card edge connector 110 has a board-receiving slot 112 to accommodate the printed circuit board 100 inside of which multiple electrical contacts 113 are arranged in two mutually-opposed rows. When the printed circuit board 100 is inserted in the board-receiving slot 112, the contacts 113 make sliding electrical connection with respective conductive pads 102 arranged on the upper and lower surfaces of the printed circuit board 101. Latch-ejection members 114, the purpose of which is to latch the printed circuit board 100 in the board-receiving slot 112 or to eject it therefrom, are pivotally mounted at the ends of housing 111 by pins 115 so that the latch-ejection members 114 operate in a pivotal manner relative to the housing 111.

However, in some cases, the conductive pads 102 on the upper and lower surfaces of the printed circuit board 101 must be connected together by means of via holes when such pads are used as grounding pads. In such cases, the via holes are positioned near the ends of the conductive pads 102, i.e., at the ends opposite to the edge 103 of the board main body 101 so that the via holes would not interfere with contacts 113. The problem is that in such cases, the width of the conductive pads 102 must be increased in the direction of the gliding of the contacts 113 by a portion equal to at least the diameter of the via holes, thus making it necessary to increase the width of the printed circuit board 100 by the same amount.

Another problem is the fact that in the process of insertion of the printed circuit board 100 in the board-receiving slot 112, the contacts 113 rub against the edge 103 of the printed circuit board 100. As a result, a powdered substance is produced that may affect the electrical connections between the contacts 113 and the conductive pads 102.

SUMMARY OF THE INVENTION

Therefore, the purpose of the present invention is to provide a printed circuit board with conductive pads formed on upper and lower surfaces of a board main body that has a smaller width in the direction of sliding engagement with electrical contacts and that makes it possible to establish a smooth electrical connection with the electrical contacts even if a powdered substance is produced.

The printed circuit board according to the present invention has conductive pads formed near an edge of the main body of the circuit board on upper and lower surfaces thereof so that the conductive pads establish electrical connections with electrical contacts as the contacts slide from the edge of the board main body inwardly, and by the fact that via holes establish electrical connection between conductive pads on the upper and lower surfaces of the main body of the circuit board and that such via holes are located in the paths of the contacts.

Contact members of the electrical contacts enraging the conductive pads have a curved or arcuate surface, the radius of which is greater than the radius of the via holes, thus providing for a better electrical connection.

BRIEF DESCRIPTION OF THE DRAWINGS

An embodiment of the present invention will now be described by way of example with reference to the accompanying drawings in which:

FIGS. 1A and 1B show plan views of a printed circuit board according to the present invention; FIG. 1A is a plan view of a first layer of the printed circuit board, FIG. 1B is a cutaway plan view of a second layer of the printed circuit board.

FIG. 2A is a cutaway plan view of a third layer of the printed circuit board, FIG. 2B is a bottom plan view of a fourth layer of the printed circuit, board.

DETAILED DESCRIPTION OF THE INVENTION

Figures 2A, 2B:
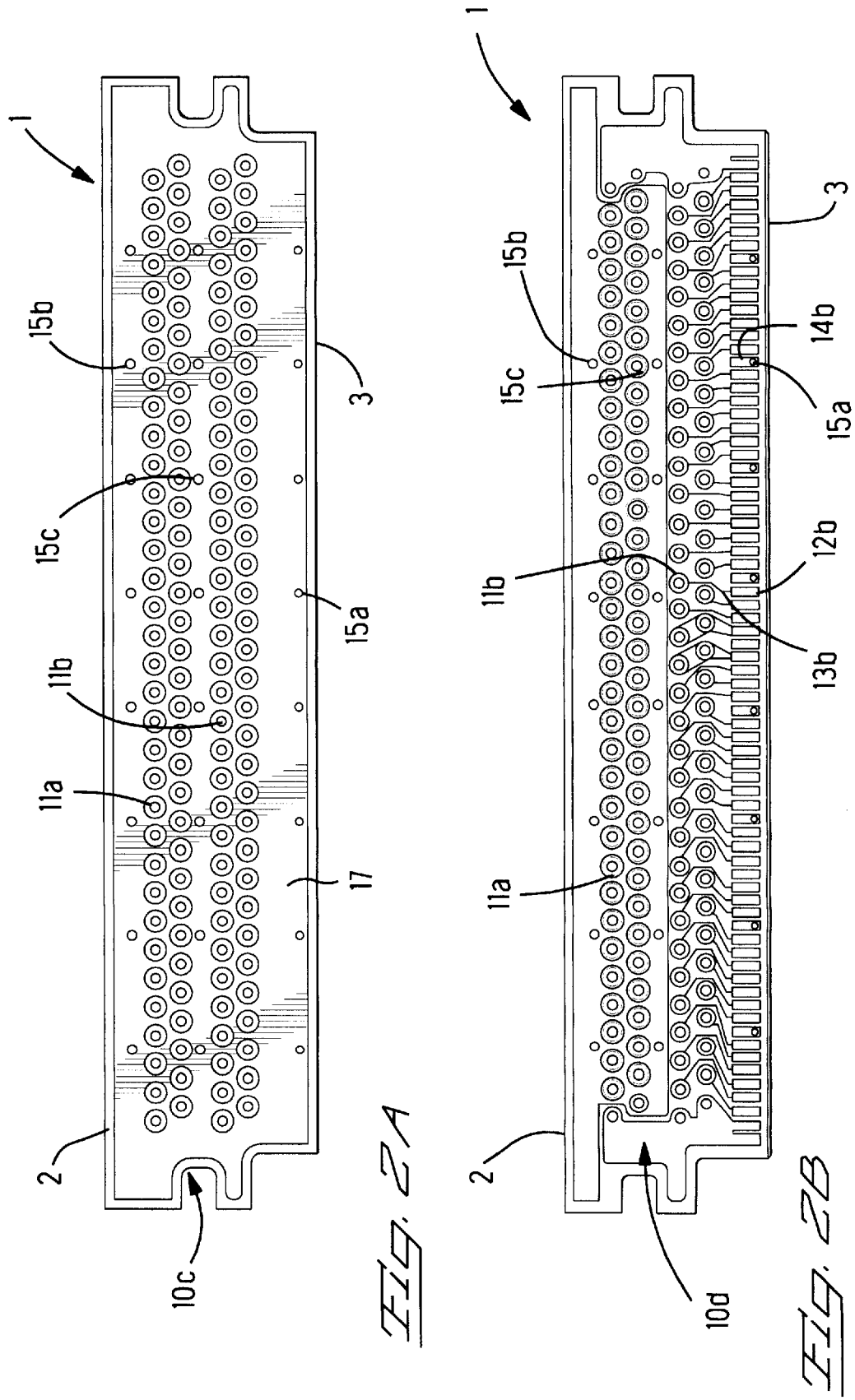
FIGS. 2A and 2B show additional plan views of the printed circuit board according to the present invention.

As can be seen from FIGS. 1 and 2, the printed circuit board 1 comprises a generally rectangular board main body 2 comprising four electrical circuits constituting a four-layer circuit board. The first layer of the board main body 2 has electrical circuit 10a (FIG. 1A), the second layer has electrical circuit 10b (FIG. 1B), the third layer has electrical circuit 10c (FIG. 2A) and the fourth layer has electrical circuit 10d (FIG. 2B). The layers are insulated from each other by an insulating material that formulates the circuit board. The circuit 10a of the first layer is arranged on a front or upper surface of the board main body 2, and the circuit 10d of the fourth layer is arranged on a back or lower surface of the board main body 2.

The electrical circuit 10a of the first layer of the printed circuit board 1 shown in FIG. 1A is primarily a signal-routing electrical circuit containing multiple through holes 11a, 11b intended to receive signal terminals of an electrical connector (not shown), multiple signal conductive pads 12a intended to form electrical connections with signal contacts of an edge connector that are different from the previously-mentioned connector, multiple conductive paths 13a connecting through holes 11a (out of through holes 11a and 11b) with the signal conductive pads 12a, and multiple grounding conductive pads 14a forming connection with the grounding contacts 20 (see FIG. 4) of the edge connector. Signal conductive pads 12a and grounding conductive pads 14a are arranged in one row along and near an edge 3 of the board main body 2. The grounding conductive pads 14a are located between the signal conductive pads 12a at predetermined intervals.

The electrical circuit 10b of the second layer of the printed circuit board 1 shown in FIG. 1B is mainly a grounding circuit comprising multiple through holes 11a, 11b that form electrical connection with the signal terminals of the connector and a grounding plane 16 that covers the entire area except for through holes 11a, 11b. The electrical circuit 10c of the third layer of the printed circuit board 1 shown in FIG. 2A is similar to the electrical circuit 10b of the second layer and comprises through holes 11a, 11b and a grounding plane 17 that covers the entire area except for through holes 11a, 11b.

The electrical circuit 10d of the fourth layer of the printed Circuit board 1 shown in FIG. 2B is primarily a signal-routing circuit containing multiple through holes 11a, 11b intended to receive signal terminals of the connector, multiple signal conductive pads 12b intended to form electrical connections with signal contacts of the edge connector, multiple conductive paths 13b connecting through holes 11b (out of through holes 11a and 11b) with the signal conductive pads 12b, and multiple grounding conductive pads 14b forming electrical connection with the grounding contacts 20 of the edge connector (not shown). Signal conductive pads 12b and grounding conductive pads 14b are arranged in one row along and near the edge 3 of the board main body 2 similarly to the signal conductive pads 12a and the grounding conductive pads 14a of the first layer.

As shown in FIGS. 1 and 2, multiple via holes 15b, 15c are provided in the printed circuit board 1 that pass through upper and lower surfaces of the board main body 2 connecting together the grounding plane 16 located in the circuit 10b of the second layer and the grounding plane 17 located in the circuit 10c of the third layer. These via holes 15b, 15c receive the grounding terminals of the connector (not shown).

Figure 3:
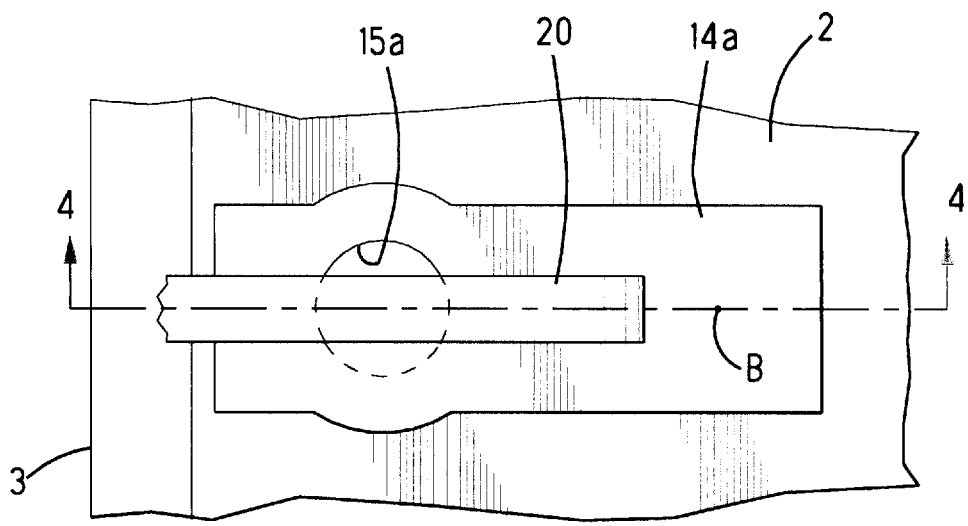
FIG. 3 is an enlarged view of detail according to the arrow A in FIG. 1A; the detail is shown together with an electrical contact sliding over a conductive pad with a via hole therethrough.
Figure 4:
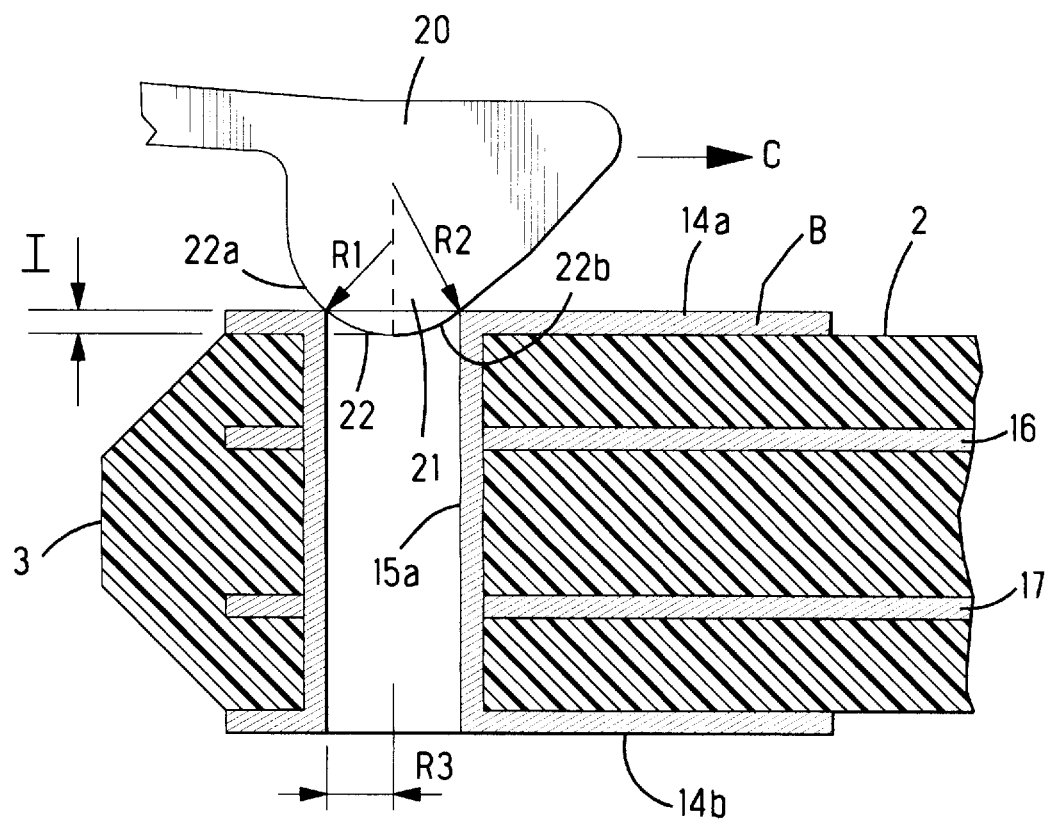
FIG. 4 is a cross-sectional view taken along line 4—4 in FIG. 3.
Figure 5:
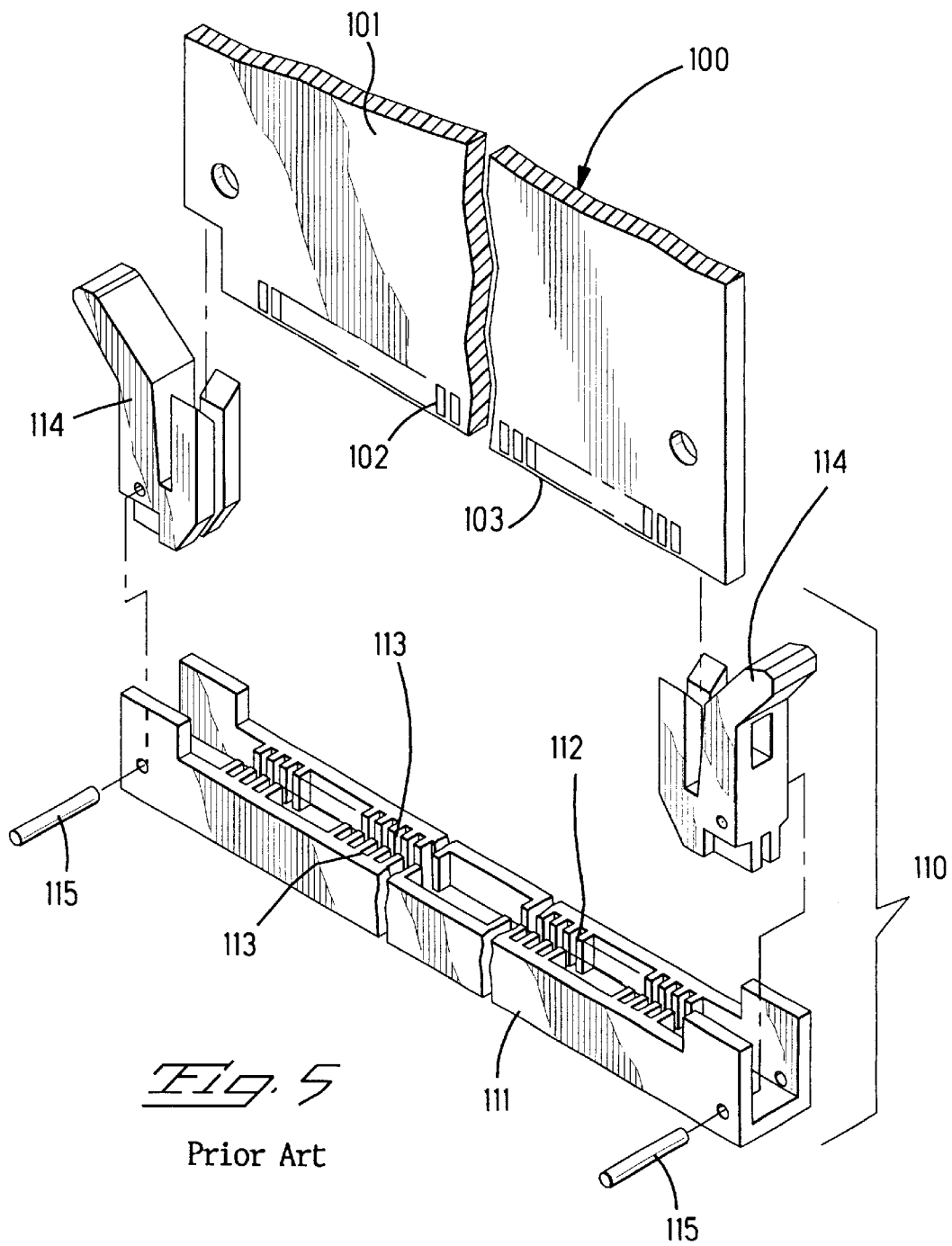
FIG. 5 is an exploded perspective view of a conventional printed circuit board and a cardedge electrical connector in which the printed circuit board is to be received.

As shown in FIGS. 1 through 4, multiple via holes 15a passing through the board main body 2 are provided along the edge 3 of the board main body 2 that electrically connect together the grounding conductive pads 14a, 14b located on the front and back surfaces of the board main body 2. These via holes 15a connect the grounding surface 16 located in the circuit 10b of the second layer and the grounding surface 17 located in the circuit 10c of the third layer. The contact members 21 of the grounding contacts 20 of the edge connector slide, as shown in FIGS. 3 and 4, in the direction of the arrow C from the edge 3 of the board main body 2 toward the end B of the grounding conductive pads 14a, 14b of the printed circuit board 1 (only the contact that makes electrical connection with the conductive pad 14a is shown in the drawing).

Therefore, the grounding terminal of the connector implements the connection of the via holes 15b, 15c, the grounding planes 16, 17, via holes 15a, the grounding conductive pads 14a, 14b by means of the grounding contact 20 to the grounding circuit of the edge connector. All via holes 15a, as can be seen from FIGS. 3 and 4, are arranged in the paths of the contacts 20 sliding over the conductive pads 14a from the edge 3 of the board main body 2.

It is also feasible to arrange the via holes 15a so that they are not in the paths of contacts 20, but at the ends of the conductive pads 14a, 14b that do not come in contact with contacts 20 (ends that are opposite to the edge 3 of the board main body). However, in such a case, the conductive pads must be elongated in the direction of contact sliding to a portion equivalent to the diameter of the via holes, thereby resulting in an increase of the width of the printed circuit board in the direction of the contacts sliding by the same amount. This invention makes it possible to reduce the width of the printed circuit board 1 in the direction of the contacts gliding by an amount equivalent to the diameter of the via hole 15a by placing the via hole 15a in the paths of the contacts 20. In addition, the powdered substance produced by the friction of contacts 20 against the edge 3 of the printed circuit board 1 is pushed by the contact members 21 of the contacts 20 into the via holes 15a where it is discharged down through the via holes 15a. This results in a better electrical connection between the contacts 20 and the conductive pads 14a.

On the other hand, when placing the via holes 15a in the paths of the contacts 20 it is necessary to give attention to the fact that, as can be seen in FIG. 4, the contact members 21 of the contacts 20 extend into via holes 15a. However, since the contact members 21 have a curved surface 22 the radius of which is larger than the radius of via holes 15a, it does not hinder the sliding of the contacts 20 even when the contact members 21 extend into the via holes 15a. Specifically, the radius R3 of the via hole 15a is 0.15 mm, while the curved surface 22 of contact member 21 has a section 22a of a small radius R1 of 0.2 mm and a section 22b of a large radius R2 of 0.4 mm, thereby resulting in the depth I of the curved surface 22 of only 0.04 mm into the via hole 15a, which does not amount to much of a hindrance.

In the embodiment of the present invention, the printed circuit board 1 comprises four layers of electrical circuits (from the first to the fourth); however, the invention is not limited to this specific number and provided that the board main body 2 has the front and the back circuit boards, it may comprise any number of circuit boards.

The printed circuit board according to the present invention has via holes connecting conductive pads formed near an edge of the board main body on upper and lower surfaces of the main body. Since the via holes are located in the paths of the contacts sliding from the edge of the board main body, it is possible to reduce the width of the printed circuit board in the direction of the contacts sliding. In addition, since the powdered substance produced by friction of the electrical contacts against the edge of the printed circuit board is pushed by the contacts to the via holes where it is discharged down through the via holes, the electrical connection between the contacts and the conductive pads is accomplished in a smooth manner.

In addition, in the printed circuit board according to the present invention, the contact members of the electrical contacts forming electrical connections with the conductive pads have a curved surface, the radius of which is greater than the radius of the via holes at the time when the contacts slide over the via holes, the contact members extend into the via holes only slightly, and the via holes do not create a hindrance for their movement.

What is claimed is:

1. A printed circuit board for electrical connection to electrical contacts of an electrical connector, comprising:
   a main body section having an edge for engagement with the electrical connector;
   conductive pads located along upper and lower surfaces of the main body section adjacent the edge for sliding electrical engagement with respective electrical contacts of the electrical connector as the electrical contacts slide therealong;
   through holes extending through the main body section and in electrical engagement with selected conductive pads on the upper and lower surfaces, the through holes positioned proximate the edge of the main body section and in the paths of engagement of respective electrical contacts of the electrical connector and the conductive pads, whereby as the printed circuit board is moved into engagement with the electrical contacts, any powdered substance produced by the friction of the electrical contacts against the edge of the main body section is pushed by the electrical contacts into the through holes where it is discharged.

2. A printed circuit board as claimed in claim 1, wherein the radius of each through hole is less than curved surfaces of the respective electrical contact that extends into the through hole.

3. A printed circuit board as claimed in claim 2, wherein the main body section constitutes a four-layer circuit board, a first layer and a fourth layer include first and fourth electrical signal circuits thereon and being disposed along upper and lower surfaces of the main body section, a second and a third layer include second and third electrical ground circuits thereon and being disposed along upper and lower surfaces of the main body section, a second and a third layer include second and third electrical ground circuits thereon and being disposed in a parallel manner within the main body section; rows of secondary through holes extending through the main body section interconnecting the first electrical signal circuit with the fourth electrical signal circuit, conductive paths interconnecting the secondary through holes with the conductive pads on the upper and lower surfaces, and further through holes via electrical contacts extending through the main body section connecting together the second and third electrical ground circuits.

4. A printed circuit board as claimed in claim 3, wherein the hollow via electrical contacts in electrical engagement with the selective conductive pads on the upper and lower surfaces are in electrical engagement with the second and third electrical ground circuits.

5. A circuit board assembly comprising:

a housing having electrical contacts with curved surfaces provided therein;

a substrate having a main body portion with a mating edge which is received in the housing;

conductive pads located along upper and lower surfaces of the main body section adjacent the mating edge for sliding electrical engagement with respective electrical contacts as the electrical contacts slide therealong, through holes extending through the main body section and in electrical engagement with selected conductive pads on the upper and lower surfaces, the through holes positioned proximate the edge of the main body section and in the paths of engagement of respective electrical contacts and the conductive pads;

whereby as the substrate is moved into engagement with the electrical contacts, any powdered substance produced by the friction of the electrical contacts against the edge of the main body section is pushed by the electrical contacts into the through holes where it is discharged.

* * * * *